(12) United States Patent
Rudeck

(10) Patent No.: US 6,680,508 B1
(45) Date of Patent: Jan. 20, 2004

(54) VERTICAL FLOATING GATE TRANSISTOR

(75) Inventor: Paul Rudeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,476

(22) Filed: Aug. 28, 2002

(51) Int. Cl.⁷ .................................. H01L 29/788
(52) U.S. Cl. ................................................ 257/316
(58) Field of Search ......................... 257/314, 315, 257/316, 242, 263, 266, 302, 319, 326, 328, 329; 438/257, 259, 268, 270

(56) References Cited

U.S. PATENT DOCUMENTS

| | | | |
|---|---|---|---|
| 5,338,953 A | * 8/1994 | Wake | 257/316 |
| 5,350,937 A | * 9/1994 | Yamazaki et al. | 257/316 |
| 5,376,814 A | * 12/1994 | Lee | 257/334 |
| 5,460,988 A | * 10/1995 | Hong | 438/259 |
| 5,990,509 A | * 11/1999 | Burns et al. | 257/296 |
| 6,033,957 A | 3/2000 | Burns, Jr. et al. | |
| 6,091,102 A | * 7/2000 | Sekariapuram et al. | 257/316 |
| 6,157,061 A | * 12/2000 | Kawata | 257/316 |
| 6,238,976 B1 | * 5/2001 | Noble et al. | 438/259 |
| 6,376,312 B1 | 4/2002 | Yu | |
| 6,403,419 B1 | * 6/2002 | Kim et al. | 438/257 |
| 6,423,599 B1 | 7/2002 | Yu | |
| 6,424,001 B1 | 7/2002 | Forbes et al. | |
| 6,433,382 B1 | * 8/2002 | Orlowski et al. | 257/315 |
| 6,548,856 B1 | * 4/2003 | Lin et al. | 257/315 |
| 2002/0096703 A1 | * 7/2002 | Vora | 257/315 |

* cited by examiner

*Primary Examiner*—Carl Whitehead, Jr.
*Assistant Examiner*—Jennifer M Dolan
(74) *Attorney, Agent, or Firm*—Leffert Jay & Polglaze, P.A.

(57) ABSTRACT

A floating gate transistor has been described that includes source and drain regions that are fabricated on different horizontal planes. A floating gate and a control gate are fabricated vertically to control current conducted through the transistor. The control gate is coupled to a word line that is formed with the control gates and extends in a common horizontal direction.

7 Claims, 9 Drawing Sheets

VERTICAL FLOATING GATE TRANSISTOR

FIELD OF THE INVENTION

The present invention relates generally to non-volatile memory cells and in particular the present invention relates to flash memory cells.

BACKGROUND OF THE INVENTION

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and is can also made of doped polysilicon. The control gate is electrically separated from the floating gate by another dielectric layer. Thus, the floating gate is "floating" in dielectric so that it is insulated from both the channel and the control gate.

As semiconductor devices get smaller in size, designers are faced with problems associated with the production of memory cells that consume a small enough amount of surface area to meet design criteria, yet maintain sufficient performance in spite of this smaller size.

For the reasons stated above, and for other reasons stated below which will become apparent to those skilled in the art upon reading and understanding the present specification, there is a need in the art for an improved non-volatile memory cell.

SUMMARY OF THE INVENTION

The above-mentioned problems with non-volatile memory cells and other problems are addressed by the present invention and will be understood by reading and studying the following specification.

In one embodiment, a pair of floating gate transistors comprises a pillar of silicon vertically extending from a substrate, an implanted drain region located in a top region of the pillar; and a pair of source regions implanted in the substrate. The pair of source regions are located on opposite sides of the pillar. First and second floating gates are located on opposite sides of the pillar and insulated from the pillar by gate oxide. First and second control gates are located on opposite sides of the pillar and insulated from the first and second floating gates.

In another embodiment, a non-volatile memory array comprises a pillar of silicon vertically extending from a substrate, an implanted drain region located in a top region of the pillar; and a pair of source regions implanted in the substrate. The pair of source regions are located on opposite sides of the pillar. First and second floating gates are located on opposite sides of the pillar and insulated from the pillar by gate oxide. First and second control gates are located on opposite sides of the pillar and insulated from the first and second floating gates. The first and second control gates are fabricated as parallel polysilicon rails, and the pair of source regions are fabricated as parallel source implant rails generally extending under the first and second control gates. A drain contact vertically extends from the top region of the pillar, and first and second source contacts vertically extend from the pair of source regions. A source conductor is coupled to a top of the first and second source contacts. Finally, a drain conductor is coupled to a top of the drain contact. The source and drain conductors extend in a horizontal direction generally perpendicular to the control gates.

A method of fabricating non-volatile memory cells comprises forming a pillar of silicon vertically extending above a substrate, implanting a drain region in a top of the pillar, and implanting first and second source regions in the substrate and adjacent to the pillar. The first and second source regions are located on opposite sides of the pillar. The method further comprises depositing a gate oxide on at least vertical sides of the pillar facing the first and second source regions, forming floating gates adjacent to and on opposite sides of the pillar, and forming first and second control gates insulated from the floating gates and located on opposite sides of the pillar.

DETAILED DESCRIPTION OF THE DRAWINGS

Figure 1:
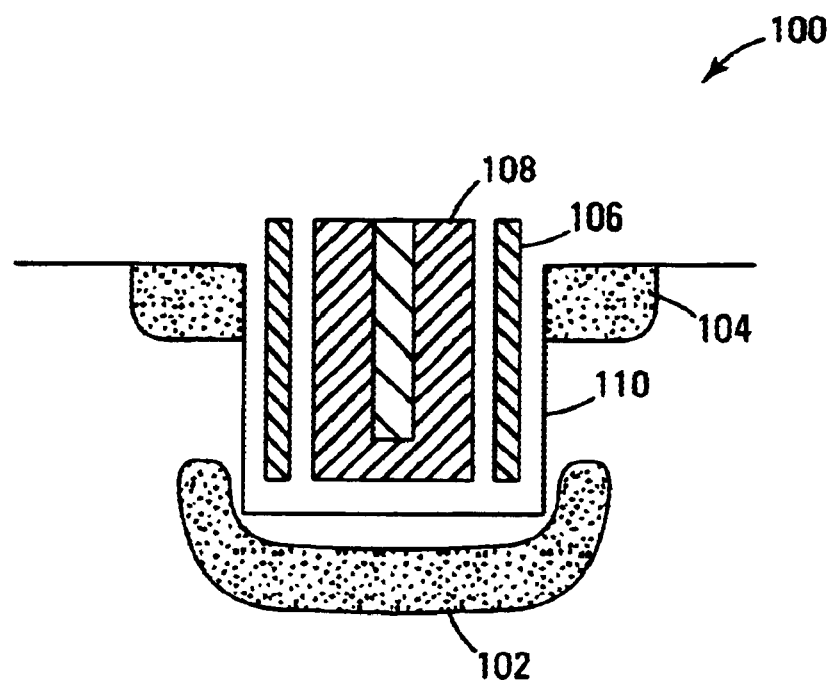
FIG. 1 is a cross-section of floating gate transistors of an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

To aid in the interpretation of the detailed description and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

In addition, as the structures formed by embodiments in accordance with the present invention are described herein, common semiconductor terminology such as N-type, P-type, N+ and P+ will be employed to describe the type of conductivity doping used for the various structures or regions being described. The specific levels of doping are not believed to be germane to embodiments of the present invention; thus, it will be understood that while specific dopant species and concentrations are not mentioned, an appropriate dopant species with an appropriate concentration to its purpose, is employed.

The term conductor is understood to also include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

Non-volatile memory cells, as explained above, can be formed as floating gate transistors. While the area of the transistors can be reduced, the coupling ratio between the floating gate and the control gate is also reduced. Generally, as the gate-coupling ratio between the floating gate and the control gate decreases, the work voltage necessary to operate the memory transistor increases. As a consequence, the operational speed and efficiency of the flash memory decrease tremendously.

Some methods for increasing the gate-coupling ratio include: increasing the overlapped area between the floating and the control gate, reducing the thickness of the dielectric layer between the floating gate and the control gate, and increasing the dielectric constant (k) of the dielectric layer between the floating gate and the control gate. Generally, to achieve an increase in the overlapped area between the floating and control gates and thus increase the gate-coupling ratio, the size of the floating gate has to be increased. However, this is not desirable for the demands of today's highly-integrated technologies.

Referring to FIG. 1, a cross-section view of two floating gate transistors 100 according to one embodiment of the present invention is provided. The transistors includes a source 102, drain 104, floating gate 106 and a control gate 108. Unlike prior transistors, the source and drain regions of the transistors of the present invention are not located in a common horizontal plane of the memory device substrate.

As explained below, the source and drain regions are fabricated in different planes such that a channel 110 of the transistor extends in a vertical direction. The floating gate and control gate also extend vertically into the substrate to control the transistor.

Figure 3:
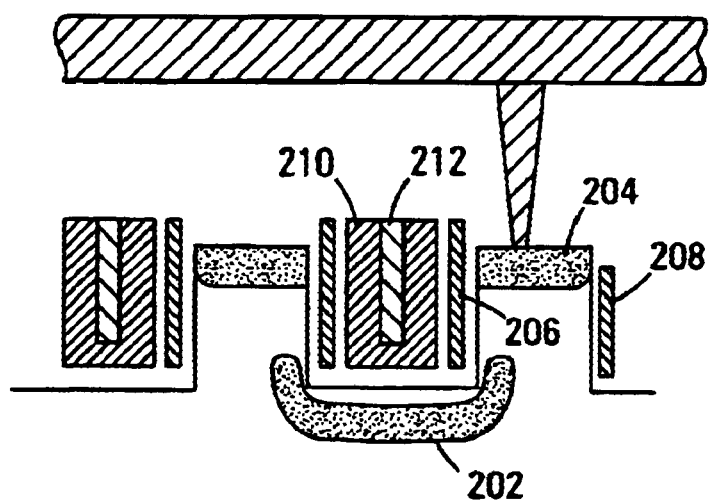
FIG. 3 is a cross-section of the memory array of FIG. 2.
Figure 2:
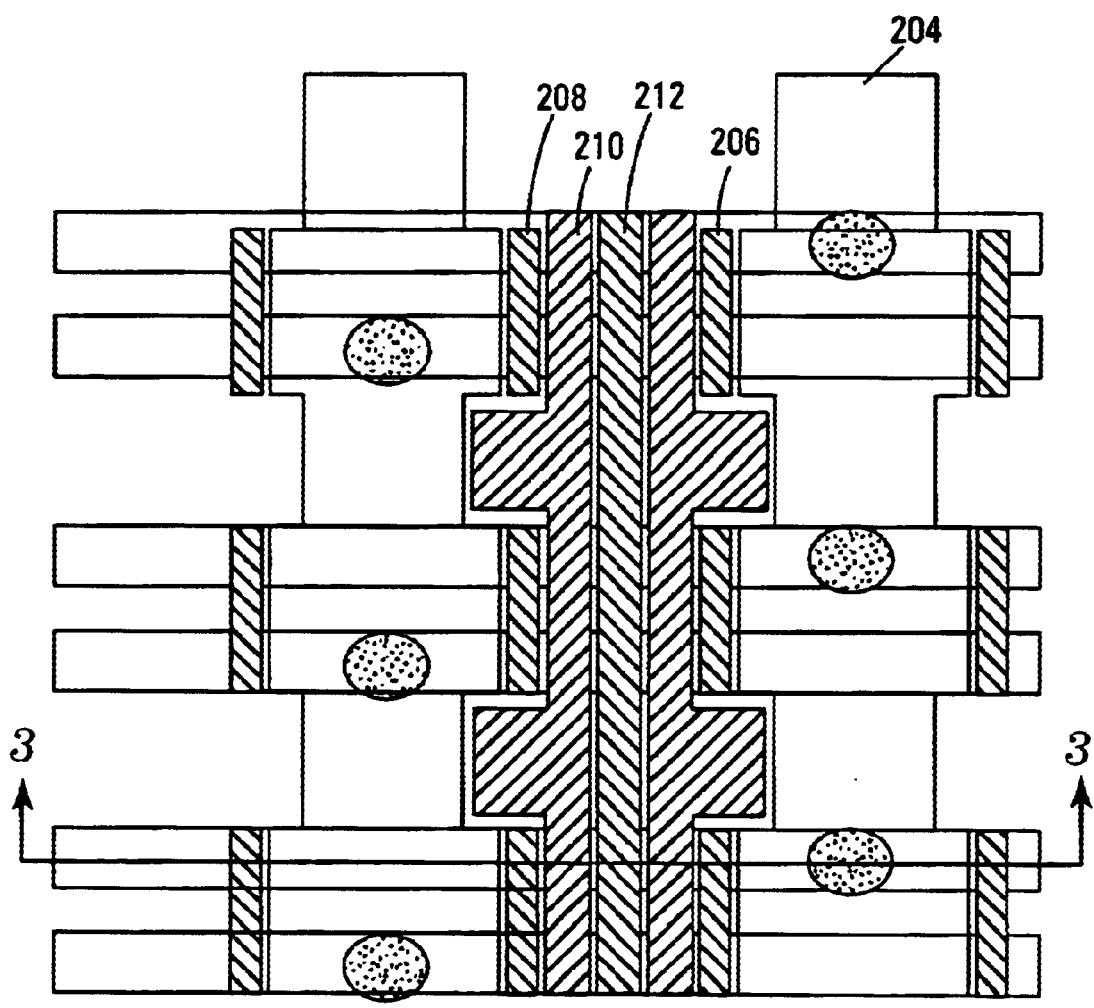
FIG. 2 is a plan view of a portion of a memory array of an embodiment of the present invention.

As shown in FIGS. 2 and 3, multiple floating gate memory cell transistors are fabricated in a substrate 200. FIG. 2 is a plan view of a portion of a memory array and FIG. 3 is a cross-section view of the array. The transistors share a common diffused source region 202, and the drain regions 204 are fabricated in a plane above the source region. Two adjacent transistors have independent floating gates 206 and 208 fabricated in trenches. A control gate 210 is fabricated between memory cells and is coupled to a word line 212 that runs parallel to the length of the control gates. Described in an alternate way, a pillar of silicon has two transistors fabricated therein. A top of the pillar has a common drain and two source regions are formed toward the bottom of the pillar. Floating gates are formed on opposite sides of the pillar. Each floating gate has a separate control gate. The sources and control gates extend in general parallel directions.

The features of one embodiment of the present invention can be described in greater detail with reference to a method of fabricating the transistors. The method is described in sufficient detail to provide an understanding of one method to form transistors of the present invention. It will be understood by those skilled in the art that all process steps are not described in detail herein, and that extra steps or modifications of the steps may be needed depending upon the integrated circuit design and manufacturing equipment.

Figure 4:
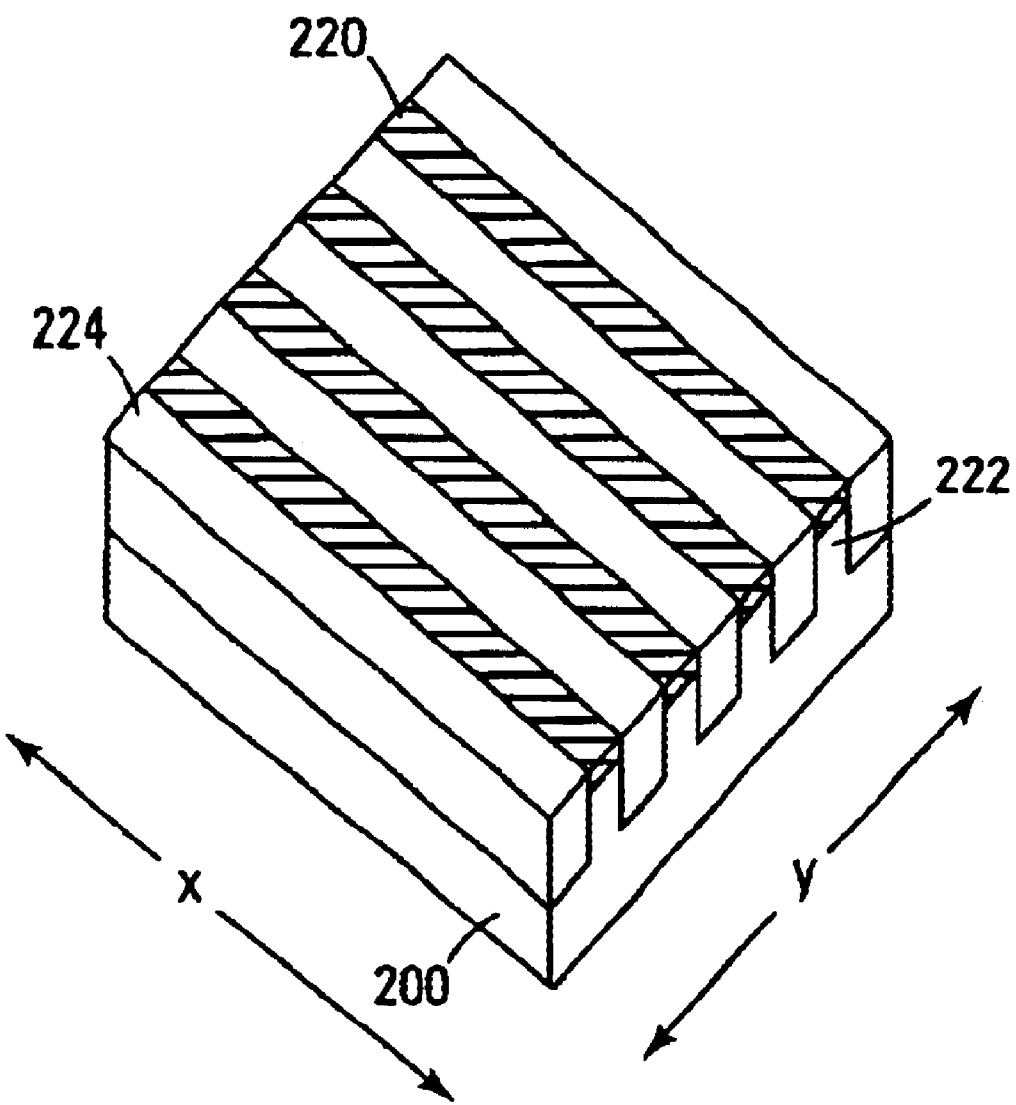
FIGS. 4–15 illustrate a fabrication process of an embodiment of the present invention.
Figure 5:
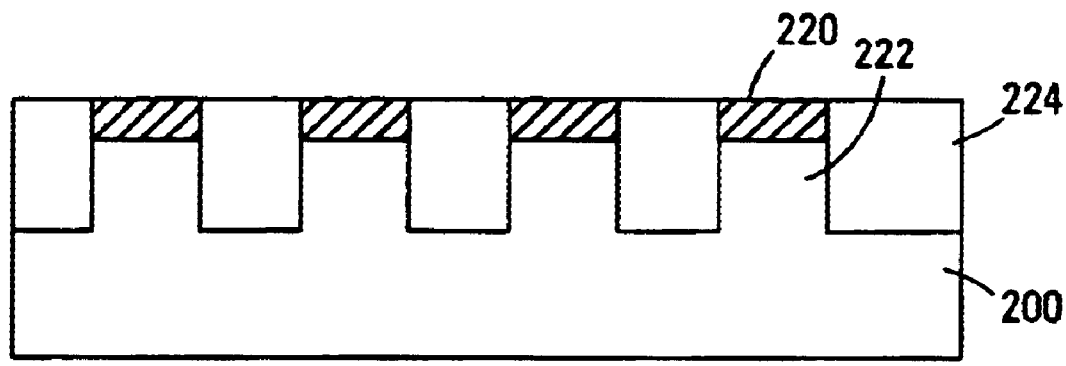

FIG. 4 is a perspective cross-section view of a semiconductor substrate. The substrate has a layer of oxide (not shown) and a layer of Nitride 220 formed on the top surface of the substrate. The Nitride layer is then patterned and etched in the X direction to form shallow trenches 222 into the substrate. A layer of thin oxide is then grown and the trenches are filled with oxide 224. A chemical-mechanical planarization (CMP) operation is then performed to remove oxide above the Nitride layer. As such, the trenches are replaced with oxide isolation rows extending in the X direction; see the side view illustrated in FIG. 5.

Figure 7:
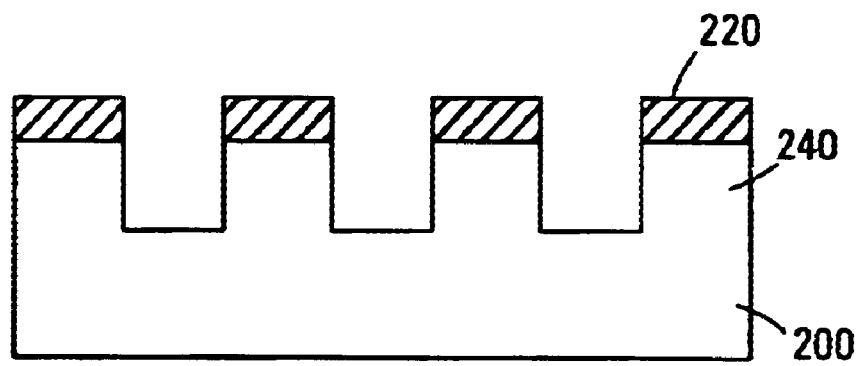
Figure 6:
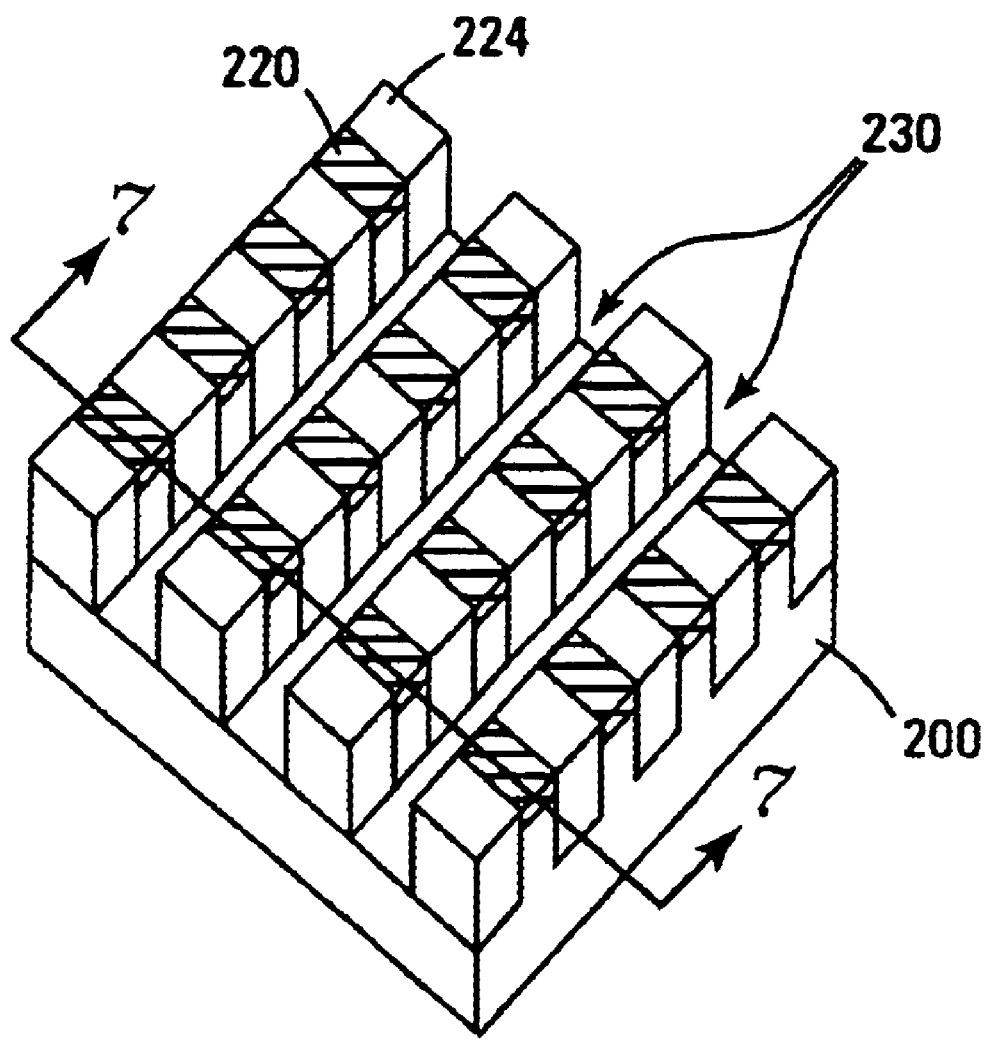

Referring to FIGS. 6 and 7, the top surface is then patterned and etched to form trenches running perpendicular to the oxide isolation rows. As a result, pillars 240 of substrate (active) material and oxide isolation 224 are formed. Floating gates and control gates will be formed in the trenches, as described below. As such, two transistors are formed using one active pillar. Each transistor has a separate control gate formed on opposite sides of the pillar.

Figure 8:
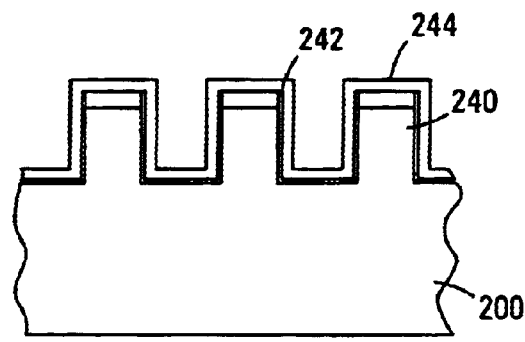
Figure 9:
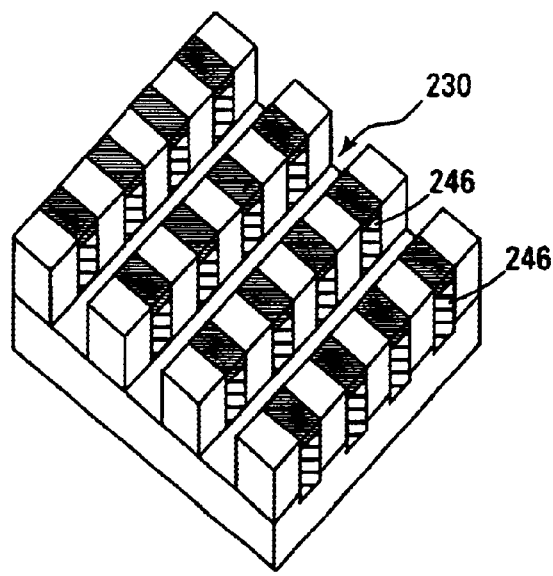
Figure 10:
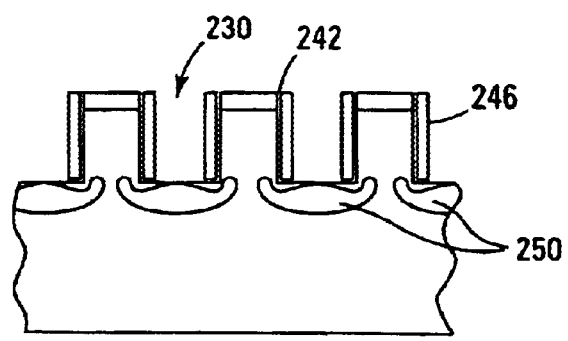

A tunnel oxide layer 242 is grown over the pillars and a layer of polysilicon 244 is deposited over the oxide, see FIG. 8. This layer of polysilicon is used to form the floating gates. Optionally, a layer of silicide can be combined with the polysilicon to form the floating gates. Referring to FIGS. 9 and 10, the polysilicon is patterned and etched to define the vertical edges of the floating gates 246. The horizontal edges of the floating gates are formed during the etch, or using a second subsequent etch operation. An implant operation is performed to form the source regions 250 in the bottom of the trenches 230. As such, the sources are located vertically beneath the control gate locations.

Figure 11:
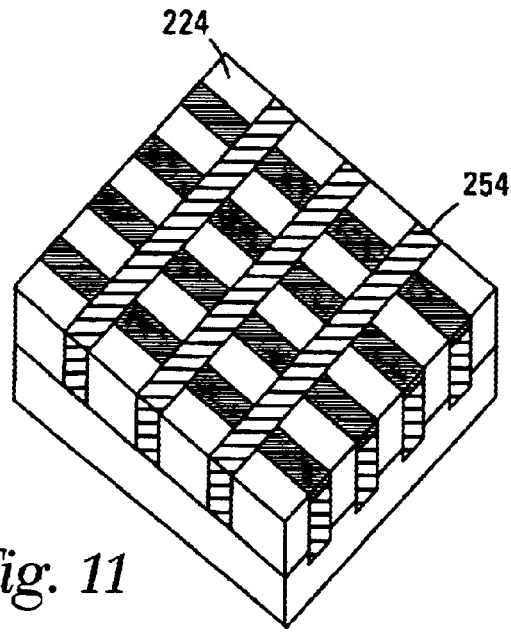
Figure 12:
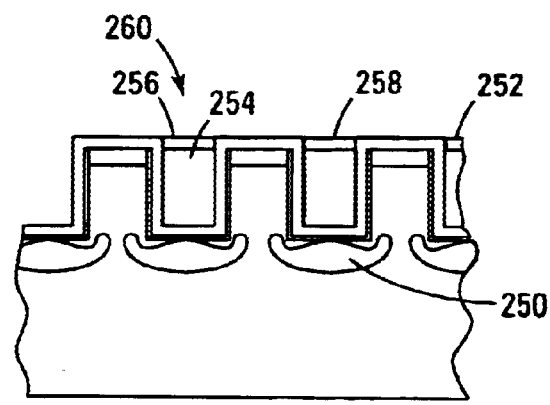
Figure 13:
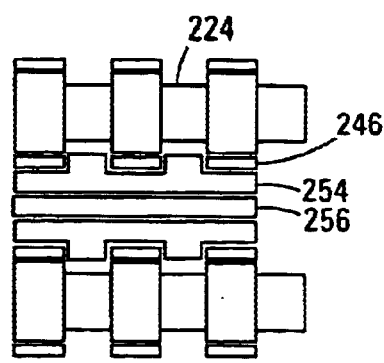

Referring to FIGS. 11–13, an oxide-nitride-oxide (ONO) thin film dielectric 252 is deposited to insulate the second floating gates and a polysilicon layer 254 is deposited. A layer of tungsten 256 is deposited in the groove 258 of the polysilicon. A CMP operation is then performed to remove portions of the tungsten and second polysilicon to form the control gate 260. The cross-section of the control gate, see FIG. 12, resembles a U-shape polysilicon channel, or rail, with a center of tungsten.

Figure 15:
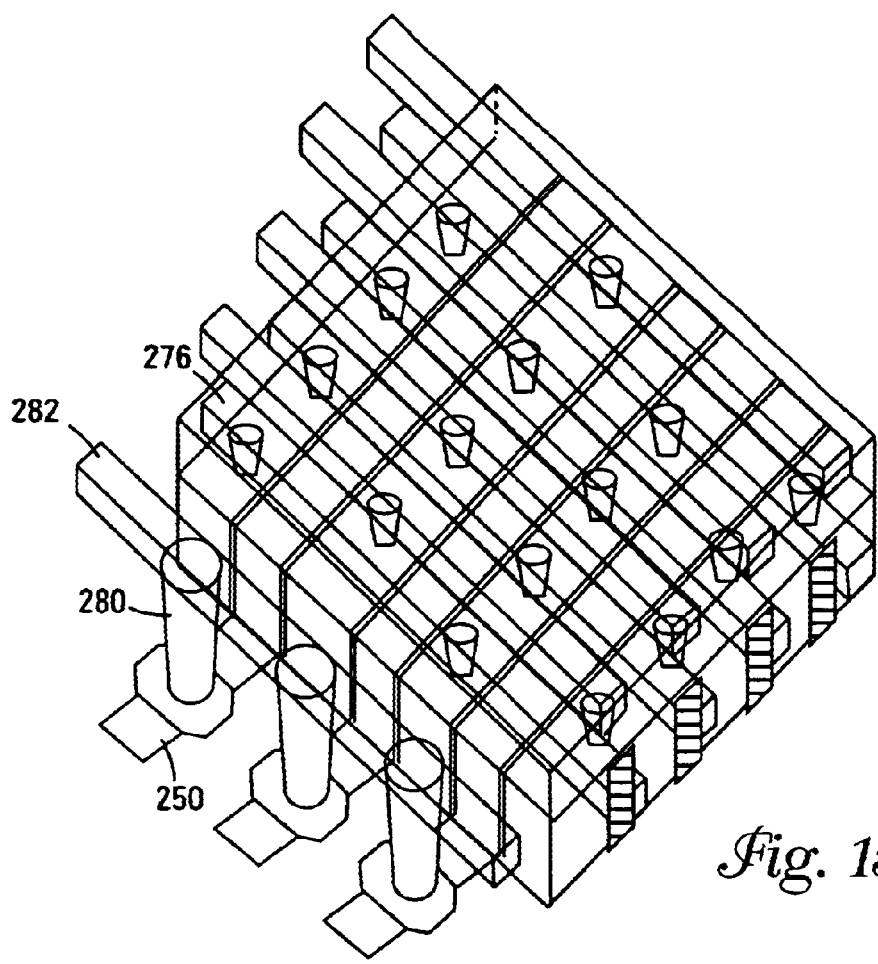
Figure 14:
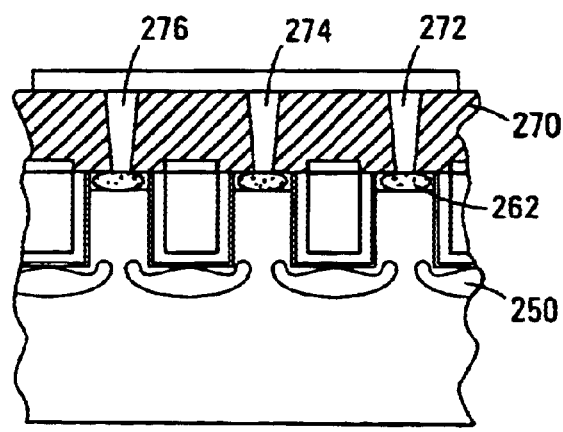

In subsequent processes, the nitride material 220 is stripped and the drain regions 262 are formed through an implant operation at the top of the pillars. An insulating layer 270, such as boro-phospho-silicate glass (BPSG), is deposited and processed to form contact openings. The contact openings are filled with a conductor or semiconductor to form contacts 274. A metal layer is then formed and processed to create bit lines 276 coupled to the drain regions via the contacts 274, see FIG. 14. FIG. 15 illustrates the source regions 250 and source contacts 280 that provide electrical contact between the source and a source line 282.

Figure 16:
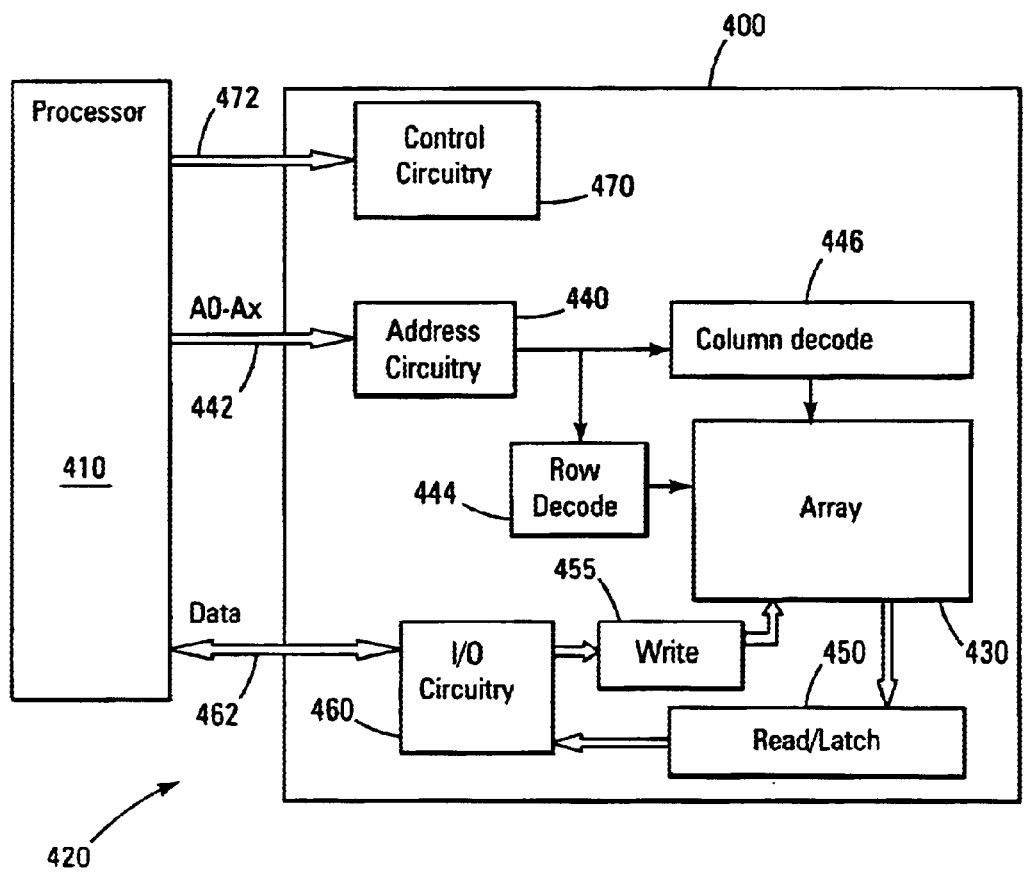
FIG. 16 is a block diagram of a memory of an embodiment of the present invention.

FIG. 16 is a functional block diagram of a memory device 400, of one embodiment of the present invention, which is coupled to a processor 410. The memory device 400 and the processor 410 may form part of an electronic system 420. The memory device 400 has been simplified to focus on features of the memory that are helpful in understanding the present invention. The memory device includes an array of memory cells 430. The memory cells are non-volatile floating-gate memory cells with vertical floating gates. The memory array 430 is arranged in banks of rows and columns.

An address buffer circuit 440 is provided to latch address signals provided on address input connections AO-Ax 442. Address signals are received and decoded by row decoder 444 and a column decoder 446 to access the memory array 430. It will be appreciated by those skilled in the art, with the benefit of the present description, that the number of address input connections depend upon the density and architecture of the memory array. That is, the number of addresses increases with both increased memory cell counts and increased bank and block counts.

The memory device reads data in the array 430 by sensing voltage or current changes in the memory array columns using sense/latch circuitry 450. The sense/latch circuitry, in one embodiment, is coupled to read and latch a row of data from the memory array. Data input and output buffer circuitry 460 is included for bi-directional data communication over a plurality of data (DQ) connections 462 with the processor 410. Write circuitry 455 is provided to write data to the memory array.

Command control circuit 470 decodes signals provided on control connections 472 from the processor 410. These signals are used to control the operations on the memory array 430, including data read, data write, and erase operations. The flash memory device has been simplified to facilitate a basic understanding of the features of the memory. A more detailed understanding of internal circuitry and functions of flash memories are known to those skilled in the art.

CONCLUSION

A floating gate transistor has been described that includes source and drain regions that are fabricated on different horizontal planes. A floating gate and a control gate are fabricated vertically to control current conducted through the transistor. The control gate is coupled to a word line that is formed with the control gates and extends in a common horizontal direction.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A pair of floating gate transistors comprising:

a pillar of silicon as a vertical extension of a substrate;

an implanted drain region located in a top region of the pillar;

a pair of source regions implanted in the substrate, wherein the pair of source regions are located on opposite sides of the pillar;

first and second floating gates located on opposite sides of the pillar and insulated from the pillar by gate oxide;

first and second control gates located on opposite sides of the pillar and insulated from the first and second floating gates such that the first and second control gates are fabricated as polysilicon rails parallel to the pillar and leaving the top region of the pillar substantially exposed; and a wordline parallel to and between the first and second control gates.

2. The pair of floating gate transistors of claim 1 wherein the pair of source regions are fabricated as parallel source implant rails generally extending under the first and second control gates.

3. The pair of floating gate transistors of claim 1 wherein the first and second control gates are fabricated as unshaped polysilicon rails with tungsten cores.

4. A pair of floating gate transistors comprising:

a pillar of silicon as a vertical extension of a substrate;

an implanted drain region located in a top region of the pillar;

a pair of source regions implanted in the substrate, wherein the pair of source regions are located on opposite sides of the pillar;

first and second floating gates located on opposite sides of the pillar and insulated from the pillar by gate oxide; and first and second control gates located on opposite sides of the pillar and insulated from the first and second floating gates, wherein the first and second control gates are fabricated as u-shaped polysilicon rails with tungsten cores that are parallel to the pillar and leave the top region of the pillar substantially exposed.

5. The pair of floating gate transistors of claim 4 further comprising:

a drain contact vertically extending from the top region of the pillar; and first and second source contacts vertically extending from the pair of source regions.

6. The pair of floating gate transistors of claim 5 further comprising:

a source conductor coupled to a top of the first and second source contacts; and a drain conductor coupled to a top of the drain contact, wherein the source and drain conductors extend in a horizontal direction generally perpendicular to the control gates.

7. A non-volatile memory device comprising:

control circuitry to manage read and write operations;

an array of memory cells to store data; and input/output circuitry coupled to the array, wherein the array comprises
  a plurality of silicon pillars as vertical extensions of a substrate;
  implanted drain regions located in a top region of the pillars;
  source regions implanted in the substrate and located between the pillars;
  floating gates located on opposite sides of the pillars and above the source regions, wherein the floating gates are insulated from the pillars by a gate oxide;
  control gate lines located on opposite sides of the pillars and insulated from the floating gates, wherein the control gates have word lines of the array located between two control gates, the control gates running parallel to the pillars and a top portion of each control gate extending over the floating gates and leaving exposed the top region of the pillars;
  a source conductor electrically coupled to the source regions; and
  a bit lines electrically coupled to the drain regions, wherein the source conductor and the bit lines extend in a horizontal direction generally perpendicular to the control gates.

* * * * *

UNITED STATES PATENT AND TRADEMARK OFFICE
CERTIFICATE OF CORRECTION

PATENT NO. : 6,680,508 B1
DATED : January 20, 2004
INVENTOR(S) : Paul Rudeck

It is certified that error appears in the above-identified patent and that said Letters Patent is hereby corrected as shown below:

<u>Column 6,</u>
Line 31, replace "fabricated as unshaped" with -- fabricated as u-shaped --

Signed and Sealed this

Fifteenth Day of June, 2004

JON W. DUDAS
*Acting Director of the United States Patent and Trademark Office*